United States Patent [19]

Girard

[11] 4,395,581
[45] Jul. 26, 1983

[54] CONCAVE MIRROR CONSTITUTED BY A PLURALITY OF PLANE FACETS AND SOLAR GENERATOR COMPRISING SUCH A MIRROR

[75] Inventor: Alain Girard, Cros de Cagnes, France

[73] Assignee: Societa Nationale Industrielle Aerospatiale, Paris, France

[21] Appl. No.: 347,899

[22] Filed: Feb. 11, 1982

[30] Foreign Application Priority Data

Feb. 20, 1981 [FR] France .................................. 81 03409

[51] Int. Cl.³ .......................... G02B 5/08; H01L 31/04
[52] U.S. Cl. .................................... 136/246; 126/438; 350/292; 350/299
[58] Field of Search ................. 136/246, 248; 350/292, 350/299; 126/438

[56] References Cited

U.S. PATENT DOCUMENTS

| | | | |
|---|---|---|---|
| 2,987,961 | 6/1961 | Cotton et al. | 350/292 |
| 3,613,659 | 10/1971 | Phillips | 126/424 |
| 3,713,727 | 1/1973 | Markosian et al. | 350/292 |
| 3,998,206 | 12/1976 | Jahn | 126/438 |
| 4,110,010 | 8/1978 | Hilton | 350/292 |
| 4,137,897 | 2/1979 | Moore | 126/424 |
| 4,153,929 | 5/1979 | Laudenschlarger et al. | 362/348 |
| 4,218,114 | 8/1980 | Bunch | 350/292 |
| 4,234,354 | 11/1980 | Lidorenko et al. | 136/246 |

FOREIGN PATENT DOCUMENTS 2607509 1/1977 Fed. Rep. of Germany ...... 136/246

OTHER PUBLICATIONS

H. A. Wilkening, "Design of a 10 KW Photovoltaic 200:1 Concentrator", *Conf. Record, 13th IEEE Photovoltaic Specialists Conf.*, (1978), pp. 669–672.

W. B. Ittner, III, "An Array of Directable Mirrors As a Photovoltaic Solar Concentrator", *Solar Energy*, vol. 24, pp. 221–234, (1980).

*Primary Examiner*—Aaron Weisstuch
*Attorney, Agent, or Firm*—Merriam, Marshall & Bicknell

[57] ABSTRACT

The present invention relates to a concave mirror composed of a plurality of planar facets. According to the invention, all the facets are identical and the two dimensions of said facets are such that the square root of their product is at least approximately equal to the ratio of the focal distance of the mirror and of the square root of the rate of concentration of the mirror. The invention finds application in the concentration of solar energy in solar generators.

11 Claims, 6 Drawing Figures

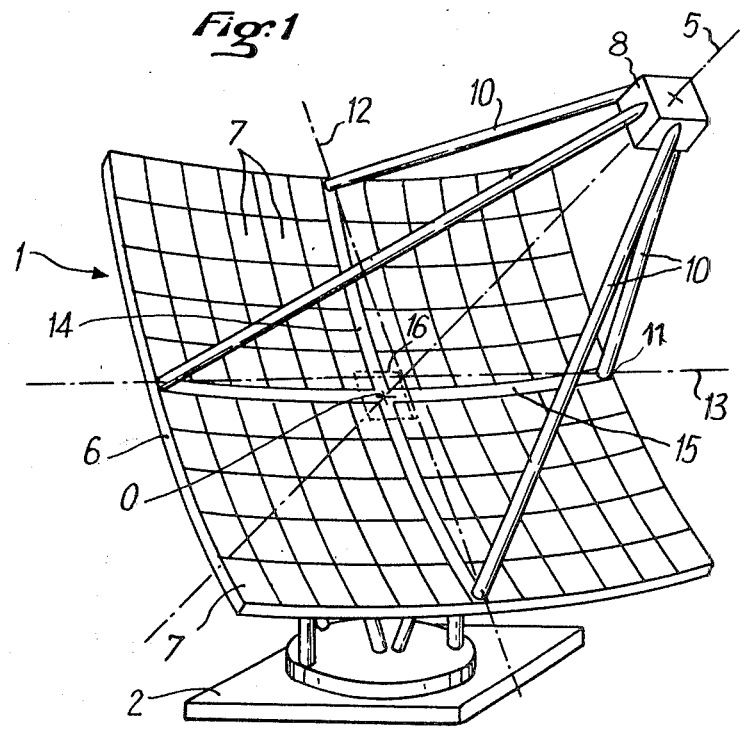
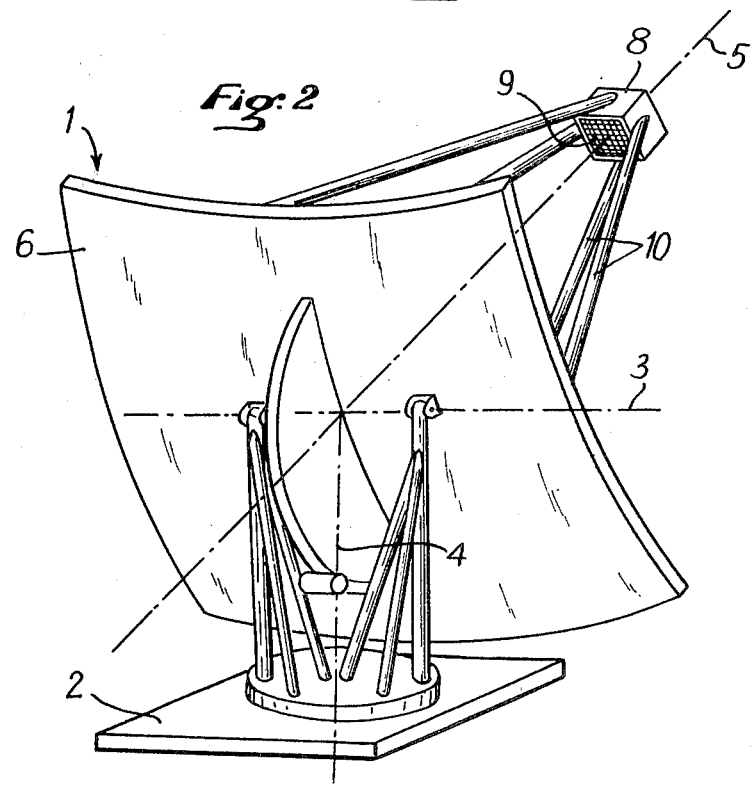

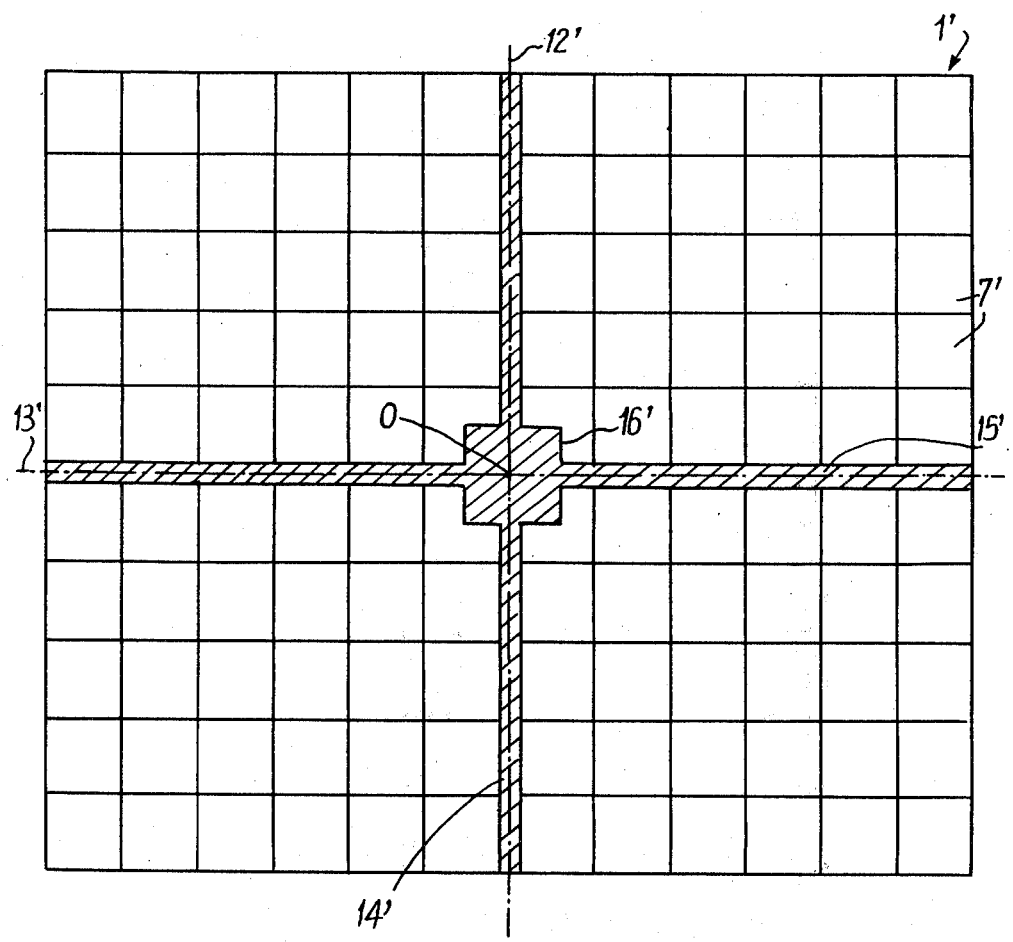

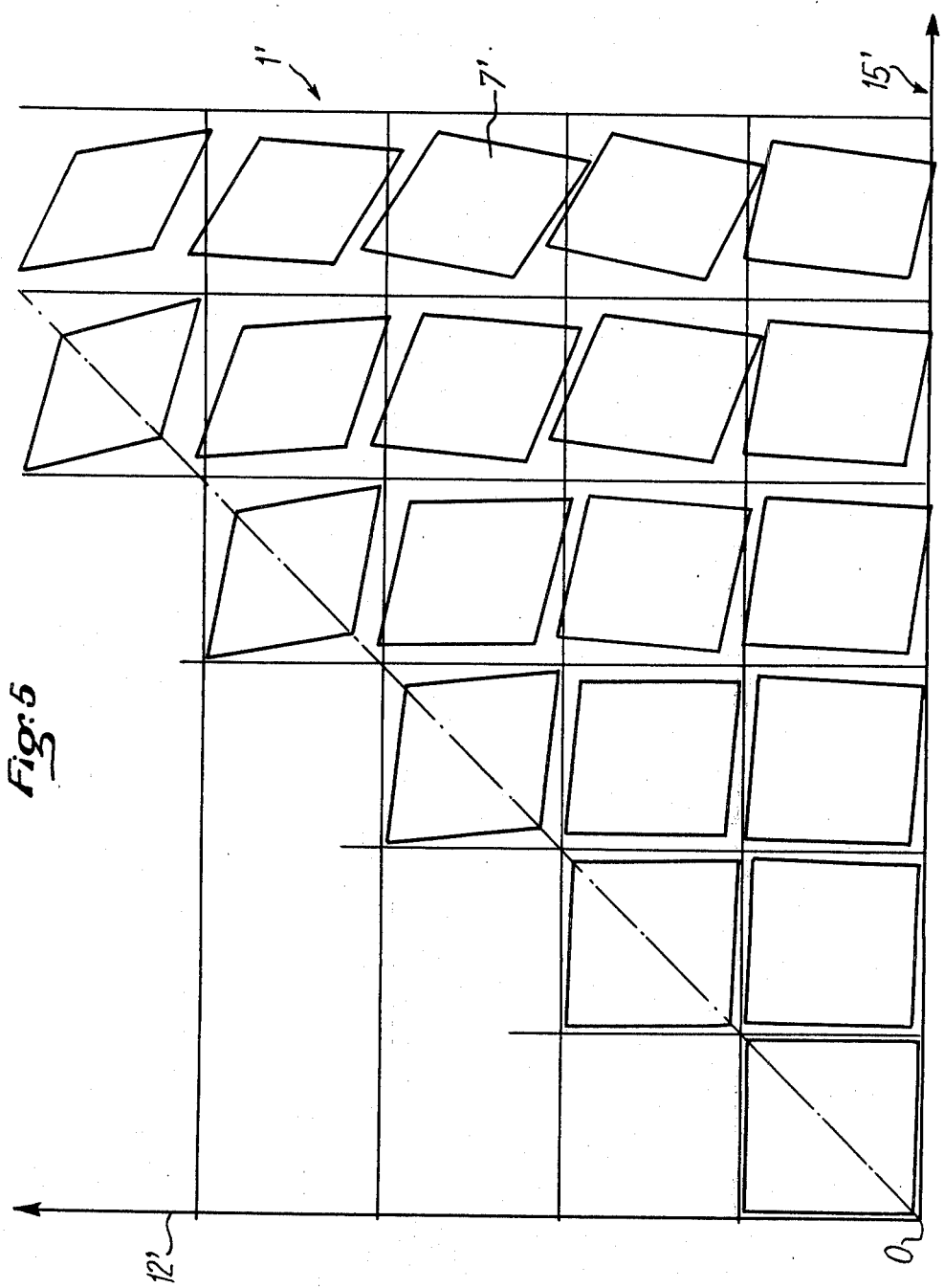

CONCAVE MIRROR CONSTITUTED BY A PLURALITY OF PLANE FACETS AND SOLAR GENERATOR COMPRISING SUCH A MIRROR

The present invention relates to a concave mirror constituted by a plurality of plane facets. It also relates to a solar generator comprising such a mirror.

It is known to use concentrators, for example constituted by concave mirrors, of large dimensions, spherical or parabolic in form, particularly with a view to producing energy from the sun.

In order to be able to construct such large-dimensioned concave mirrors easily and at non-prohibitive costs, it has already been proposed to make them with the aid of a plurality of individual reflecting facets. For example, U.S. Pat. Nos. 2,987,961 and 3,009,391 describe concave mirrors constituted by a plurality of spherical facets, whilst U.S. Pat. Nos. 3,494,231 and 3,645,606 describe parabolic mirrors formed by the juxtaposition of a plurality of parabolic facets.

The methods disclosed in the above-mentioned Patents certainly facilitate the construction of concave mirrors; however, they have the drawback of having to use facets shaped as portions of a sphere or paraboloid.

To avoid this drawback, it has already been proposed to construct concave mirrors by means of a plurality of plane reflecting facets, examples of such mirrors being given for example by U.S. Pat. Nos. 2,760,920 and 3,713,727. However, the approximation of the continuous parabolic or spherical surface of a concave mirror by a multifacet surface obtained by the juxtaposition of a multitude of individual plane facets gives the multifacet reflecting surface optical reflecting properties which are somewhat different from those presented by said continuous surface.

In an attempt to reduce these differences in reflecting properties as much as possible, the inventor of U.S. Pat. No. 2,760,920 uses "a parabolic surface which is covered or floored over with small flat rectangular mirrors so that relatively small cheap mirrors may be utilized to cover a large area and because of the smallness of the mirrors the individual reflections will be properly focused so they can be received by an absorber mounted above the reflector". In this way, according to this U.S. Pat. No. 2,760,920, to approach as near as possible the optical properties of the ideal continuous concave surface which it is desired to reconstitute by means of plane facets, a very large number of plane facets of very small dimensions is used. This method certainly makes it possible to obtain reflecting properties very similar to those of the continuous concave mirror, but, on the other hand, it is difficult and expensive to carry out due to the small size and large number of the individual reflecting facets.

In the device described in U.S. Pat. No. 3,713,727, the problem of approximation of a continuous concave reflecting surface by a concave reflecting surface with plane facets is solved differently. The inventor of this patent determines, in the focal plane of the multifacet surface, the shape (square or rectangular) and the dimensions of the desired useful focal spot and he adapts the shape and the dimensions of the reflecting facets so that the beam reflected by each of said reflecting facets gives, in the focal plane of the multifacet surface, a spot totally or partly covering said useful focal spot. Of course, particularly in the case of the beam reflected by each facet totally covering the surface of the desired focal spot, it is indispensable, in order to use the multifacet reflecting surface to a maximum and to avoid part of the radiation that it reflects from being systematically unused since it gives in the focal plane of the reflecting surface a spot passing beyond the desired useful focal spot, to adapt the dimensions of each facet as a function of the distance thereof from the axis of the reflecting surface.

U.S. Pat. No. 3,713,727 specifies to this end that the dimensions of the reflecting facets are smaller as these facets are more remote from the axis of the mirror. In this way, in this U.S. Patent, each facet has its own dimensions, with the result that manufacture of such a multifacet mirror remains long and expensive.

It is an object of the present invention to provide a multifacet mirror in which all the facets are identical, this resulting in easier manufacture thereof and reduced production costs.

To this end, according to the invention, the concave mirror which, on the one hand, is adapted to furnish, when it is aimed towards a remote light source such as the sun, a useful focal or quasifocal spot of at least substantially square or rectangular shape and of predetermined dimensions, said useful spot being centred on the axis of said mirror and of which, on the other hand, the reflecting surface is constituted by a plurality of plane facets whose shape and dimensions correspond to those of said useful spot and which are disposed in lines and columns, so that the section, in the plane of the useful spot, of the reflected beam coming from each plane facet totally covers said useful spot, is noteworthy in that all the facets are identical and the two dimensions of said facets are such that the square root of their product is at least approximately equal to the ratio of the focal distance of the mirror and of the square root of the concentration factor thereof.

In fact, the applicant has found by rule-of-thumb that, by associating the dimensions of the facets, the focal distance of the mirror, and the concentration factor of the latter (i.e. in practice the number of facets), an acceptable compromise was obtained between the unused surface of each facet as a function of the position thereof on the mirror and the zone of penumbra of the useful spot.

In the particular case of the plane reflecting facets being square, each of their sides is of such a length that it is at least approximately equal to the ratio of the focal distance of the mirror and of the square root of the concentration factor of said mirror.

Each facet preferably presents dimensions substantially equal to those of the useful spot and, in the lines and columns, the individual facets are rotated, in their plane and about their centre, so that the section, in the plane of the useful spot, of the beam reflected by each of them totally covers said useful spot, the amplitude of this rotation being all the greater as the facet is more remote from the vertex of the mirror. Empirical formulae for placing the corners of said facets will be given in the description with reference to the Figures.

Thus, due to this other feature, all the light spots emitted by said facets can be made to cover said useful spot completely, even if the dimensions of the facets are very close to those of the useful spot.

It will be noted that, in the mirror according to the invention, the overall reflected beam is uniform. In fact, this overall reflected beam is the sum of the individual beams reflected by each of the plane facets; now, each of these reflected beams is of course uniform, and the same therefore applies to the overall reflected beam.

This results in the mirror according to the invention being particularly adapted to be used, as a concentrator, in a solar generator comprising an assembly of photovoltaic cells.

In fact, it is known that a photovoltaic cell generates, under low voltage, an electric current whose intensity is substantially proportional to the illumination. Under a concentrated solar flux, this intensity may reach several amperes per $cm^2$.

In a photovoltaic generator, it is thus indispensable to dispose numerous photovoltaic cells in series to obtain the electrical power generated under reasonable voltage and intensity. However, a string of photovoltaic cells in electrical series connection furnishes a current whose intensity is equal to that of the most poorly operating cell, or of the least illuminated cell. It is therefore fundamental to illuminate a string of photovoltaic cells in electrical series in a uniform manner and to maintain said cells at equal temperatures.

The planar panels of photovoltaic cells directed towards the sun receive a uniform illumination of all the cells; however, to obtain a reasonable electrical power with such planar panels, illuminated directly by the sun, it is indispensable to provide thereon a large number of cells.

Due to the high price of the cells, it is therefore preferable, for the same desired power, to use a solar concentrator which enables the surface of said cells to be reduced, provided that said concentrator furnishes a uniform flux, like the mirror of the invention.

In this way, a solar generator comprising, on the one hand, a solar concentrator and, on the other hand, an arrangement of photovoltaic cells, will be noteworthy according to the invention in that said solar concentrator is constituted by the mirror of the invention, mentioned hereinabove, and in that the sensitive face of said arrangement of photovoltaic cells corresponds at least approximately, in shape and in dimensions, to said useful focal or quasi-focal spot and is superposed thereon.

In the generator according to the invention, said photovoltaic cell arrangement must therefore be maintained near the focus of the mirror. This may be effected in known manner by means of convergent arms abutting on the periphery of the mirror and supporting said photovoltaic cell arrangement. However, such a support arm system and photovoltaic cell arrangement has the drawback of casting a shadow on the mirror.

In this respect, it will be noted that, in the photovoltaic solar generator with concentrator mirror, any shadow cast on the mirror brings about shading of the corresponding photovoltaic cells. Due to the series-assembly thereof, this results in each cell having to be protected by a shunting diode in parallel, in order to avoid, in the event of shading, the other photovoltaic cells delivering current of opposite direction through said cell, which is manifested in a reduction in the electrical yield and an overall complication of the generator, and the apparatus which it supplies which must be adaptable to considerable variations in voltage.

On the other hand, in the photovoltaic generator according to the invention, in the case of a shadow accidentally cast on one or more facets of the mirror, the light flux on the photovoltaic cells remains uniform, although weaker, due to the structure of said mirror. All the cells continue to function in the same manner: the intensity delivered is weaker, but the voltage does not vary, or only varies a little. It becomes possible to eliminate the majority of the protecting diodes, which is translated by an increase in the electrical yield and and overal simplification of the generator.

Furthermore, according to a feature of the generator of the invention, the zones of the mirror corresponding to the zones of systematic shadow cast by the arms of the support of the photovoltaic cell arrangement and/or by said arrangement, when the axis of the mirror is aimed towards the sun, are not reflecting. In this way, the problem of the shadows cast by the structure supporting the photovoltaic cell arrangement is eliminated.

The invention will be more readily understood on reading the following description with reference to the accompanying drawings, in which:

FIG. 1 is a partial view, in perspective, of the front of a solar generator comprising a mirror according to the invention.

FIG. 2 is a partial view, in perspective, of the rear of the solar generator of FIG. 1.

FIG. 3 is a schematic view of the reflecting surface of the mirror of the generator of FIGS. 1 and 2, in projection parallel to the axis of said mirror.

FIG. 5 shows, in schematic view, one eighth of the reflecting surface of the mirror according to the invention, in projection parallel to the axis of said mirror, the rotation of the facets in their plane being exaggerated for purposes of clarity.

Figure 4:
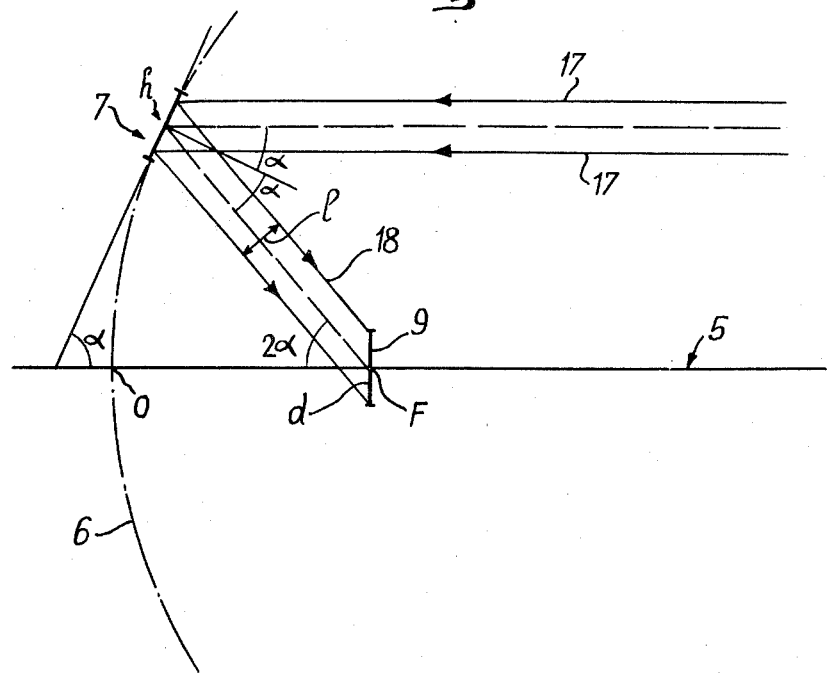
FIG. 4 is an optical diagram showing the useful portion of a facet as a function of its position.

Referring now to the drawings, the photovoltaic solar generator according to the invention, shown in FIGS. 1 and 2, comprises a concave mirror 1, mobile with respect to a base 2. Due to means which have been shown partially, the position of the mirror 1 may be automatically adjusted about an axis 3 for elevation control and a vertical axis 4 for azimuth control, so that its axis 5 is constantly oriented towards the sun.

The concave mirror 1 is constituted by a rigid concave support 6 on which are fixed identical plane facets 7 which are for example rectangular or square. The rigid support 6 may be of any nature, for example it may be made of a honeycomb or lattice structure. It may be spherical, parabolic, cylindro-parabolic, etc. in shape. However, the rigid support is preferably in the form of a paraboloid of revolution, of vertex 0 and of axis 5. The facets 7 are fixed on the support 6 by any known means, for example by adhesion or by means of a pivoting connection (not shown).

A photovoltaic cell unit 8 is provided in the vicinity of the focus of the mirror 1, so that its sensitive face 9 is centred with respect to the axis 5 and directed towards the facets 7. The shape (square or rectangular) and the dimensions of the sensitive face 9 of the unit 8 are substantially identical to those of the facets 7.

The unit 8 is supported by four arms 10 fastened to the mirror 1 on its periphery. The arms 10 are located, in pairs, in two orthogonal planes of symmetry of the support 6. In this way, the feet 11 for attachment of the arms 10 to the mirror 1 are located in two's on two right-angled axes 12 and 13. These arms 10 serve for the passage of electrical leads and fluid carrying pipes connecting the unit 8 to devices outside the solar generator (not shown).

The outer contour of the mirror 1 is in the form of a rectangle or a square, with curvilinear sides, two of said sides being in a direction generally parallel to axis 12 and the other two to axis 13.

The reflecting facets 7, which may be of any desired nature (metal, silver-coated glass, etc.) are distributed in four identical groups each comprising n×m facets distributed in n rows and m columns. In each group of facets 7, the n rows are parallel to axis 13 and the m columns parallel to axis 12. In the example shown, n and m have been chosen to be 5 and 6 respectively. The four groups of facets 7 are separated from one another by two linear zones 14 and 15, forming a cross passing through the centre of the mirror 1 and corresponding to the shadows cast by the four arms 10 when the axis 5 is aimed towards the sun.

FIG. 3 shows the distribution of the facets 7, seen in projection on a plane at right angles to axis 5 and passing through the vertex of the paraboloid. In this FIG. 3, the projections of the different elements of FIG. 1 are respectively referenced with a prime.

In the example shown, the zone of shadow 16 (16' in projection in FIG. 3) of the focal unit 8 covers four quarters of the four facets 7 directly surrounding the vertex 0. It is easy to see that these four quarters do not correspond to four facets, but, in fact, to one facet.

For practical reasons of construction, it is advantageous to provide the four facets 7 surrounding the vertex 0 to be identical to the others.

Due to the non-reflecting zones 14 and 15 which intersect at 0, the zone of shadow 16 may be greater in the two directions than an elementary facet 7, by the width of zones 14 and 15. In this way, an envelope for thermal insulation, of thickness close to half the width of the linear zones 14 and 15, may be provided on the unit 8 whose sensitive face 9 is substantially of shape and dimensions equal to a facet 7.

Thus, due to the linear zones 14 and 15, the drawbacks of the shadows which are systematically cast, are eliminated.

In order to optimize the geometry of the mirror 1 still further, the present invention provides for minimising the unused surface of each reflecting facet 7 and the penumbra zone of the focal spot.

Each facet 7, as schematically illustrated in FIG. 4, is inclined by an angle $\alpha$ with respect to the incident rays 17 which it reflects in the direction of rays 18 with an incidence $2\alpha$ in the focal plane, where the sensitive face 9 is located. If the latter has a height d and if the beam of rays 18 covers the whole height d, the width l of the beam of rays 18 is therefore equal to $l = d \cos 2\alpha$.

The width l of the beam of rays 18 corresponds to a useful part h of the facet 7 equal to $$h = \frac{l}{\cos \alpha} \text{ or to } h = d \frac{\cos 2\alpha}{\cos \alpha},$$

Since, by construction, all the facets 7 are identical and have a width close to that of the sensitive face 9, the ratio (h/d) represents the useful proportion of each facet 7. Now, this useful proportion is equal to (cos $2\alpha$/cos $\alpha$) according to the preceding calculation, so that it is less than 1.

To reduce the unused part of the facets 7, it would therefore be expedient to make $\alpha$ tend towards 0 so that the ratio (cos $2\alpha$/cos $\alpha$) tends toward 1, in other words, that the focal distance f=0F of the mirror 1 should be increased as much as possible.

However, it is known that the zone of penumbra cast by each facet on the focal spot increases when the focal distance f=0F is extended with respect to the side of each facet.

It is therefore indispensable to find a compromise between these two contradictory requirements.

According to an important feature of the invention, an acceptable compromise was found when the focal distance f=0F was equal to the product $d \times \sqrt{C}$, in which d represents the side of the square facets 7 and C the concentration factor of the mirror 1, i.e. approximately the number $4 \times n \times m$ of the facets 7.

If the facets 7 are rectangular and the lengths of their sides are $d_1$ and $d_2$ respectively, said facets must satisfy as least approximately the equation:

$$f = \sqrt{d_1 \times d_2 \times C} \text{ . Thus } \frac{f}{\sqrt{C}} = \sqrt{d_1 \times d_2}$$

In this way, due to this compromise, it is possible to use square or rectangular facets 7 which are absolutely identical to one another.

In order to increase the useful reflecting surface as much as possible, the facets 7 advantageously present dimensions slightly larger than those of the sensitive face 9.

However, for the facets remote from axis 5, the corresponding light spots on the face 9 are parallelograms, since the plane of said facets is oblique with respect to the plane of the sensitive face 9. According to another feature of the invention, so that all the parallelograms completely cover the face 9, of dimensions virtually equal to those of said facets 7, said latter are oriented as a function of their location on the mirror, by rotating them about their centre and in their plane. FIG. 5 illustrates, in projection on plane 18', 15', the orientation of the facets 7 of an eighth of the mirror 1, the rotated positions being exaggerated so as to be clearly apparent.

Figure 6:
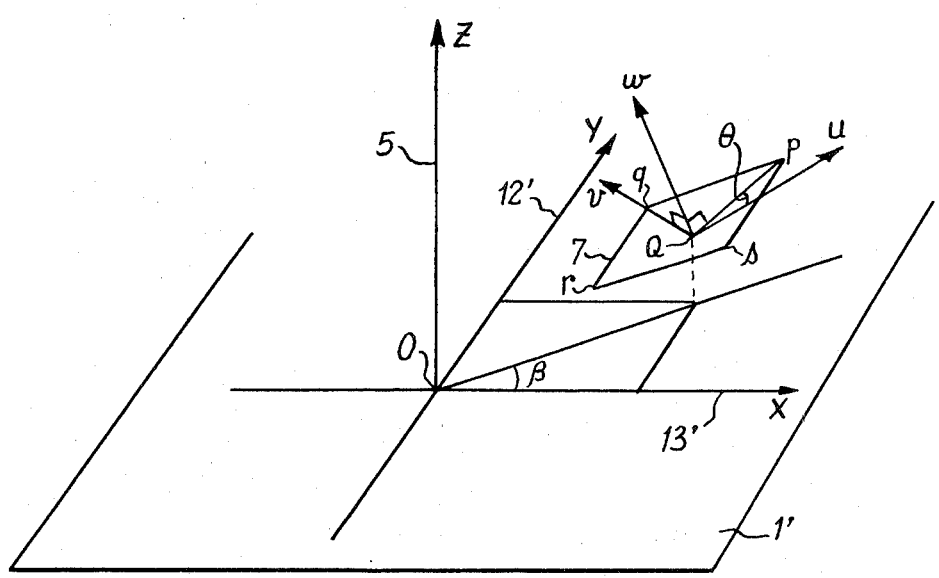
FIG. 6 shows systems of reference axes serving to define the rotation of the facets in their plane.

The rotation of said facets may be made empirically. However, Applicant has found empirical formulae for defining the adequate rotation to be given to said facets in the case of the concave mirror being a paraboloid of revolution. To this end, two systems of coordinates OX,OY,OZ and Qu,Qv,Qw (cf.FIG. 6) are firstly determined:

the system OX,OY,OZ has as origin the vertex 0 of the paraboloid; for axis OX, axis 13'; for axis OY, axis 12'; and for axis OZ, axis 5; in this system OX,OY,OZ, the coordinates of the centre Q of a facet 7 are X,Y and $$\frac{X^2 + Y^2}{4f},$$

f being the focal distance of the mirror and assuming that the facet 7 is tangential to a paraboloid of revolution of formula $X^2 + Y^2 = 4fZ$.

the system Qu, Qv, Qw has as origin the centre Q of the facet 7. The axis Qw is normal to this facet, whilst axis Qu is such that its projection of the plane XOY extends the projection of OQ. Finally, Qv is orthogonal to the plane uQw and parallel to plane XOY.

In these two systems of axes, an appropriate position of the four corners p, q, r and s of a facet 7 may be defined by values $\theta p$, $\theta q$, $\theta r$ and $\theta s$ of the angle $\theta$ between the axis Qu and axes $Q_p$, $Q_q$, $Q_r$ and $Q_s$ respectively.

In the case of rectangular facet 7 of dimensiond $d_1$ and $d_2$ (respectively parallel to OX and OY), applicant has found that these values $\theta p, \theta q, \theta r$ and $\theta s$ might be as follows:

$$\theta p = -\text{arc } tg \frac{Y}{X} - \text{arc } tg \frac{d_2}{d_1} - K \frac{X^2 + Y^2}{4f^2} \sin\left(4 \text{ arc } tg \frac{Y}{X}\right)$$

$$\theta q = -\text{arc } tg \frac{Y}{X} + \text{arc } tg \frac{d_2}{d_1} - K \frac{X^2 + Y^2}{4f^2} \sin\left(4 \text{ arc } tg \frac{Y}{X}\right)$$

$$\theta r = -\text{arc } tg \frac{Y}{X} - \text{arc } tg \frac{d_2}{d_1} + 180° +$$

$$K \frac{X^2 + Y^2}{4f^2} \sin\left(4 \text{ arc } tf \frac{Y}{X}\right)$$

$$\theta s = -\text{arc } tg \frac{Y}{X} + \text{arc } tg \frac{d_2}{d_1} + 180° +$$

$$K \frac{X^2 + Y^2}{4f^2} \sin\left(4 \text{ arc } tg \frac{Y}{X}\right)$$

in which K represents the angle by which a mirror, located at a distance from the focal axis equal to the focal distance, would be rotated.

If all the angles of these formulae are expressed in degrees, the same applies to K. It has been found that values of K close to 25° gave good results.

If the facets 7 are square, the above formulae remain valid, with $d_1 = d_2$.

What is claimed is:

1. In a concave mirror which is adapted to provide when aimed towards a remote light source such as the sun, a useful focal or quasi-focal spot of at least approximately square or rectangular form and of predetermined dimensions, said useful spot being centred on the axis of said mirror, the reflecting surface of said mirror being constituted by a plurality of identical planar facets whose shape and dimensions correspond to those of said useful spot and which are disposed in rows and in columns, so that the section of the reflected beam coming from each planar facet totally covers said useful spot, the two dimensions of said facets being such that the square root of their product is at least approximately equal to the ratio of the focal distance of the mirror and of the square root of the concentration factor of said mirror.

2. The concave mirror of claim 1, in which said facets are square.

3. The concave mirror of either one of claims 1 or 2, in which each facet presents dimensions substantially equal to those of said useful spot, wherein, in the rows and columns, the individual facets are rotated in their plane and about their centre so that the section of the beam reflected by each of them totally covers said useful spot, the amplitude of this rotation being greater as the facet is more remote from the vertex of the mirror.

4. The concave mirror of claim 3, of the paraboloid of revolution type, in which a first system of coordinates OX,OY,OZ is established such that 0 is the vertex of the mirror, OZ the axis of the mirror, OX the projection on the plane orthogonal to axis OZ at 0, of the axis of the lines of mirrors, and OY the projection on the same plane of the axis of the columns of said mirrors, as well as a second system of coordinates Qu, Qv, Qw, such that Q is the centre of a facet having the coordinates X and Y in the first system, Qw the normal to the facet at Q, Qu the axis of the plane of the facet projecting on the plane XOY in alignment with the projection on the same plane XOY of OQ, and Qv being orthogonal to the plane uQw, wherein, in these two systems of coordinates, the positions of each of the corners (p,q,r,s) of the facet are defined by the value of the angles $\theta p, \theta q, \theta r$ and $\theta s$, of vertex Q and of axis of origin Qu, such that $$\theta p = -\text{arc } tg \frac{Y}{X} - \text{arc } tg \frac{d_2}{d_1} - K \frac{X^2 + Y^2}{4f^2} \sin\left(4 \text{ arc } tg \frac{Y}{X}\right)$$

$$\theta q = -\text{arc } tg \frac{Y}{X} + \text{arc } tg \frac{d_2}{d_1} - K \frac{X^2 + Y^2}{4f^2} \sin\left(4 \text{ arc } tg \frac{Y}{X}\right)$$

$$\theta r = -\text{arc } tg \frac{Y}{X} - \text{arc } tg \frac{d_2}{d_1} + 180° +$$

$$K \frac{X^2 + Y^2}{4f^2} \sin\left(4 \text{ arc } tf \frac{Y}{X}\right)$$

$$\theta s = -\text{arc } tg \frac{Y}{X} + \text{arc } tg \frac{d_2}{d_1} + 180° +$$

$$K \frac{X^2 + Y^2}{4f^2} \sin\left(4 \text{ arc } tg \frac{Y}{X}\right)$$

in which f is the focal distance of the mirror, K represents the angle through which a mirror located at a distance from the focal axis equal to the focal distance would be rotated, and $d_1$ and $d_2$ are the lengths of the facets substantially parallel to axes OX and OY respectively.

5. The concave mirror of claim 4, wherein the different angles appearing in the formulae are expressed in degrees and K is approximately equal to 25°.

6. The concave mirror of claim 1, wherein the planar facets are tangential to the surface of a paraboloid of revolution.

7. The concave mirror of claim 1, wherein its outer contour is a curvilinear square or rectangle.

8. A solar generator comprising a solar concentrator and an arrangement of photovoltaic cells, wherein said solar concentrator is constituted by the mirror of claim 1, and the sensitive face of said arrangement of photovoltaic cells corresponds at least approximately in shape and in dimensions to said useful focal or quasi-focal spot and is superposed thereon.

9. The solar generator of claim 8, in which the photovoltaic cell arrangement is supported by arms abutting on the periphery of the mirror, wherein the zones of the mirror corresponding to the zones of shadow cast by the arms supporting the photovoltaic cell arrangement and/or by said arrangement when the axis of the mirror is aimed towards the sun, are not reflecting.

10. The solar generator of claim 9, comprising four said arms for supporting the photovoltaic cell arrangement, defining two axial planes at right angles to each other, wherein said reflecting facets are distributed in four identical groups separated from one another by said non-reflecting zones in the shape of a cross, said zones being parallel to the rows and columns of photovoltaic cells.

11. The solar generator of claim 9, wherein the shadow of the photovoltaic cell arrangement on the mirror covers the central part of the cross and the four central quarters of the four facets directly surrounding the vertex of the mirror.

* * * * *